(12) United States Patent
Shih et al.

(10) Patent No.: US 7,434,149 B2
(45) Date of Patent: Oct. 7, 2008

(54) PREDICTION DEVICE AND METHOD APPLIED IN A VITERBI DECODER

(75) Inventors: Yun-I Shih, Gueiren Township, Tainan County (TW); Hsien-Yuan Hsu, Hsinchu (TW); Hung-Jua Ting, Jhongli (TW); Chun-Hao Huang, Jiaosi Township, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 471 days.

(21) Appl. No.: 11/118,175

(22) Filed: Apr. 29, 2005

(65) Prior Publication Data

US 2006/0129903 A1   Jun. 15, 2006

(30) Foreign Application Priority Data

Dec. 9, 2004   (TW) .............................. 93138115 A (51) Int. Cl.
  *H03M 13/03*   (2006.01)
(52) U.S. Cl. ........................ 714/795; 714/819
(58) Field of Classification Search ................. 714/795, 714/794, 796, 798, 799, 819, 822
  See application file for complete search history.

(56) References Cited

U.S. PATENT DOCUMENTS

| | | | | |
|---|---|---|---|---|
| 5,684,773 A * | 11/1997 | Hayashi | .................... | 369/47.35 |
| 6,041,433 A | 3/2000 | Kamada | ..................... | 714/795 |
| 6,094,739 A * | 7/2000 | Miller et al. | ................. | 714/792 |
| 6,141,384 A * | 10/2000 | Wittig et al. | ............ | 375/240.25 |
| 6,310,887 B1 * | 10/2001 | Hatakeyama | ............... | 370/465 |
| 6,324,226 B1 * | 11/2001 | Sasagawa | .................... | 375/341 |
| 6,477,125 B1 * | 11/2002 | Hayami | .................... | 369/59.22 |
| 6,651,215 B2 * | 11/2003 | Miyauchi et al. | ............ | 714/795 |
| 7,227,472 B1 * | 6/2007 | Roe | ........................... | 340/576 |

FOREIGN PATENT DOCUMENTS

TW          595117          6/2004

OTHER PUBLICATIONS

Samirkumar Ranpara and Dong Sam Ha, "A Low-Power Viterbi Decoder Design for Wireless Communications Applications", 1999 Int. ASIC conf.
Emmanuel Boutillon, Nicolas Demassieux, "High speed low power architecture for memory management in a Viterbi decoder", 1996 IEEE.
Chien-Ming Wu, Ming-Der Shieh, Chien-Hsing Wu, and Ming-Hwa Sheu, "VLSI architecture of extended in-place path metric update for Viterbi decoders", 2001 IEEE.
Gennady Feygin and P.G. Gulak, "Architectural tradeoffs for survivor equence memory management in Viterbi decoders", 1993 IEEE.
Chien-Ching Lin, Chia-Cho Wu, and Chen-Yi Lee, "A Low Power and High Speed Viterbi Decoder Chip for WLAN Applicaions", 2003 IEEE.

* cited by examiner

*Primary Examiner*—Jacques Louis-Jacques
*Assistant Examiner*—Fritz Alphonse (57) ABSTRACT

A prediction device and method for use in a Viterbi decoder is provided. The prediction device is applicable to a communication system with low bit error rate for reducing the count of accessing path memories, thereby lowering the power consumption of the system. The prediction device needs not activate the traceback modules when making a successful prediction. In other words, no access to the path memories is required. The predicted bits decoded and outputted by the decoded bit registers are the decoded bits from the Viterbi decoder. Therefore, the prediction device saves much traceback and power consumption for decoding.

13 Claims, 10 Drawing Sheets

|  | | 3.7×10$^{-2}$ | 2.2×10$^{-2}$ | 1.2×10$^{-2}$ | 6×10$^{-3}$ |
|---|---|---|---|---|---|
|  | input BER | | | | |
|  | output BER | 5.5×10$^{-3}$ | 2.9×10$^{-3}$ | 0 | 0 |
| Distribution of path overlapping | 1st stage | 93.6% | 96.78% | 98.48% | 99.34% |
|  | 2nd stage | 3.1% | 2.1% | 1.1% | 0.057% |
|  | 3rd stage | 0.13% | 0.05% | 0.018% | 0.0039% |
|  | 4th stage | 0.33% | 0.13% | 0.049% | 0.011% |
| probability of the overlapping in the first three stages | | 97% | 98.9% | 99.7% | 99.9% |

| data rate | 6 Mbps | 9 Mbps | 12 Mbps | 18 Mbps | 24 Mbps | 36 Mbps | 48 Mbps | 54 Mbps |
|---|---|---|---|---|---|---|---|---|
| Eb/N0(dB) | 15.5 | 16.5 | 16 | 17 | 18.5 | 20.5 | 23 | 24.5 |
| number of the traced back | 1970 | 2589 | 1546 | 2397 | 1378 | 2052 | 2571 | 2063 |
| bit error rate | $2.8*10^{-2}$ | $1.1*10^{-2}$ | $8.3*10^{-3}$ | $9.2*10^{-3}$ | $3.9*10^{-3}$ | $4.8*10^{-3}$ | $4.6*10^{-3}$ | $4.6*10^{-3}$ |
| packet error rate | 0.097 | 0.104 | 0.103 | 0.111 | 0.106 | 0.098 | 0.109 | 0.101 |

FIG. 8

PREDICTION DEVICE AND METHOD APPLIED IN A VITERBI DECODER

FIELD OF THE INVENTION

The present invention generally relates to a Viterbi decoder, and more specifically to a prediction device applicable in a Viterbi decoder, and a method of forming the same.

BACKGROUND OF THE INVENTION

A Viterbi decoder can be used in convolutional decoding, and is widely used in communication systems. The Viterbi decoder employs the method of searching for the maximum likelihood sequence and calculating the minimum path metric to accomplish the error correction. The recent wireless communication products all utilize the Viterbi decoder. However, without the external power source, the wireless communication products can only be used for a limited duration as the power consumption is relatively high for the battery-powered products. Therefore, the criterion of low power consumption is important for the design of wireless communication products.

The Viterbi decoder is the module that consumes much power in the wireless communication products. The conventional Viterbi decoder uses the following two approaches: register exchange approach and traceback approach.

Figure 1:
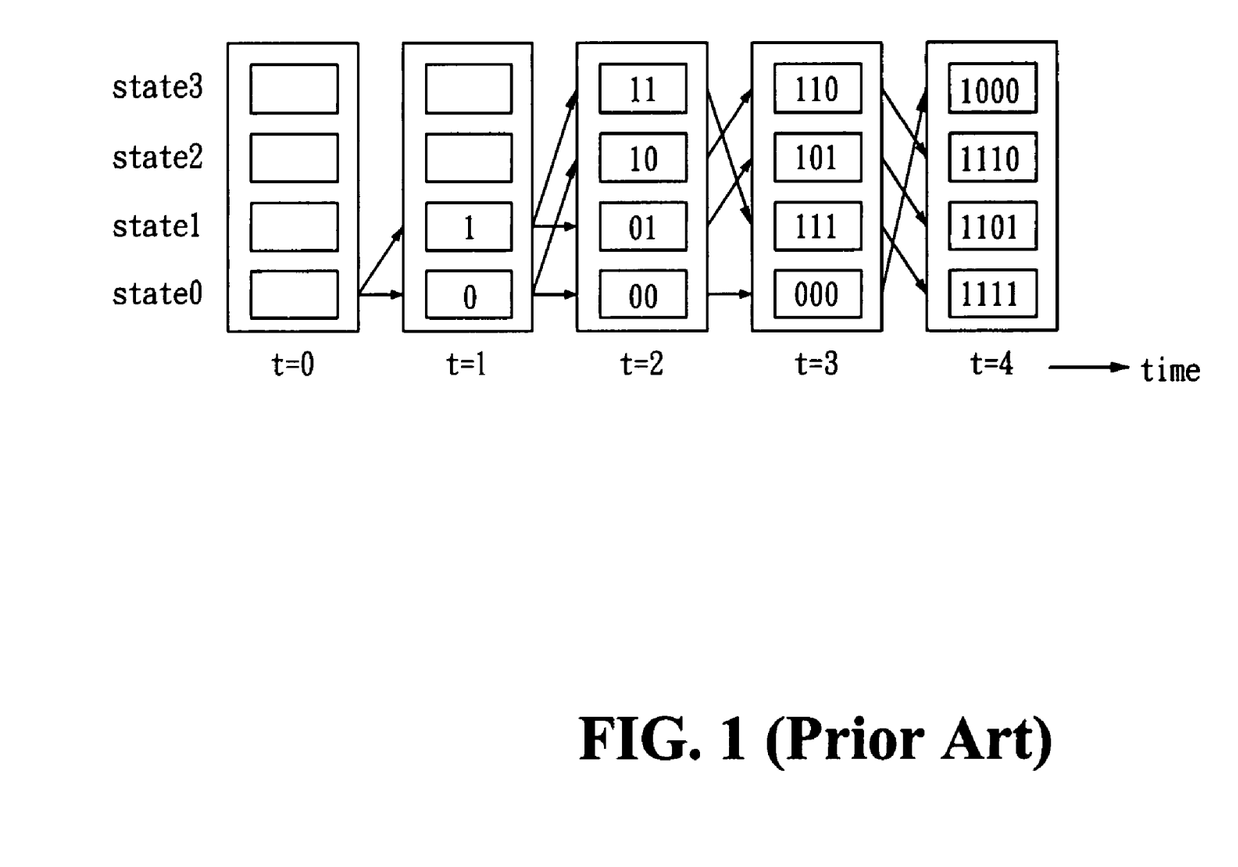
FIG. 1 shows a schematic view of a register exchange approach of a conventional Viterbi decoder.

FIG. 1 shows the register exchange approach used in a conventional Viterbi decoder. As shown in FIG. 1, this approach stores the decoded bits of the survivor path of the current state into the register when an input signal arrives. The subsequent arrival of an input signal requires the duplication of previously decoded bits and writing the current decoded bits into the register. Therefore, the bits stored in the register will increase as the input signal increases. The register exchange approach eliminates the time and the power consumption of the traceback because the value stored in the register is the decoded bit sequence when the last input signal arrives. However, the duplication of the decoded bits of the previous stage to the next stage requires high power consumption and a large memory area; therefore, this approach can only be used in low complexity and high throughput systems.

Figure 2:
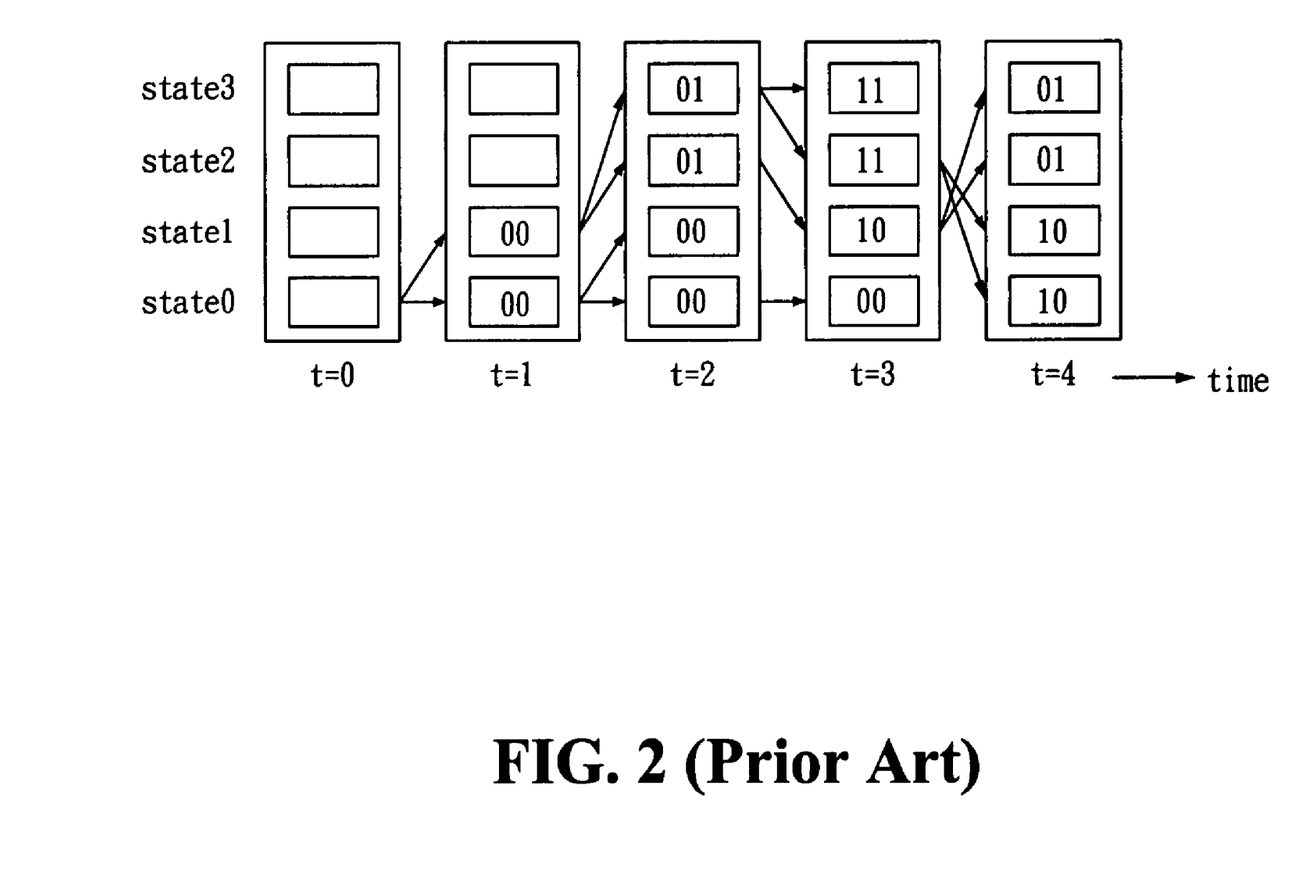
FIG. 2 shows a schematic view of a traceback approach of a conventional Viterbi decoder.

FIG. 2 shows the traceback approach of a conventional Viterbi decoder. As shown in FIG. 2, the traceback approach records the survivor branch of each state. For the Viterbi decoder with a total of four states, it requires two bits to record the survivor branch of the state and stores into the path memory. It can even use only one bit to record whether it is the upper branch or the lower branch. On traceback, by reading the path memory, with table look-up, the decoded bits can be obtained. Because this approach requires less power and smaller memory area, the traceback approach is suitable for high complexity systems.

Figure 3:
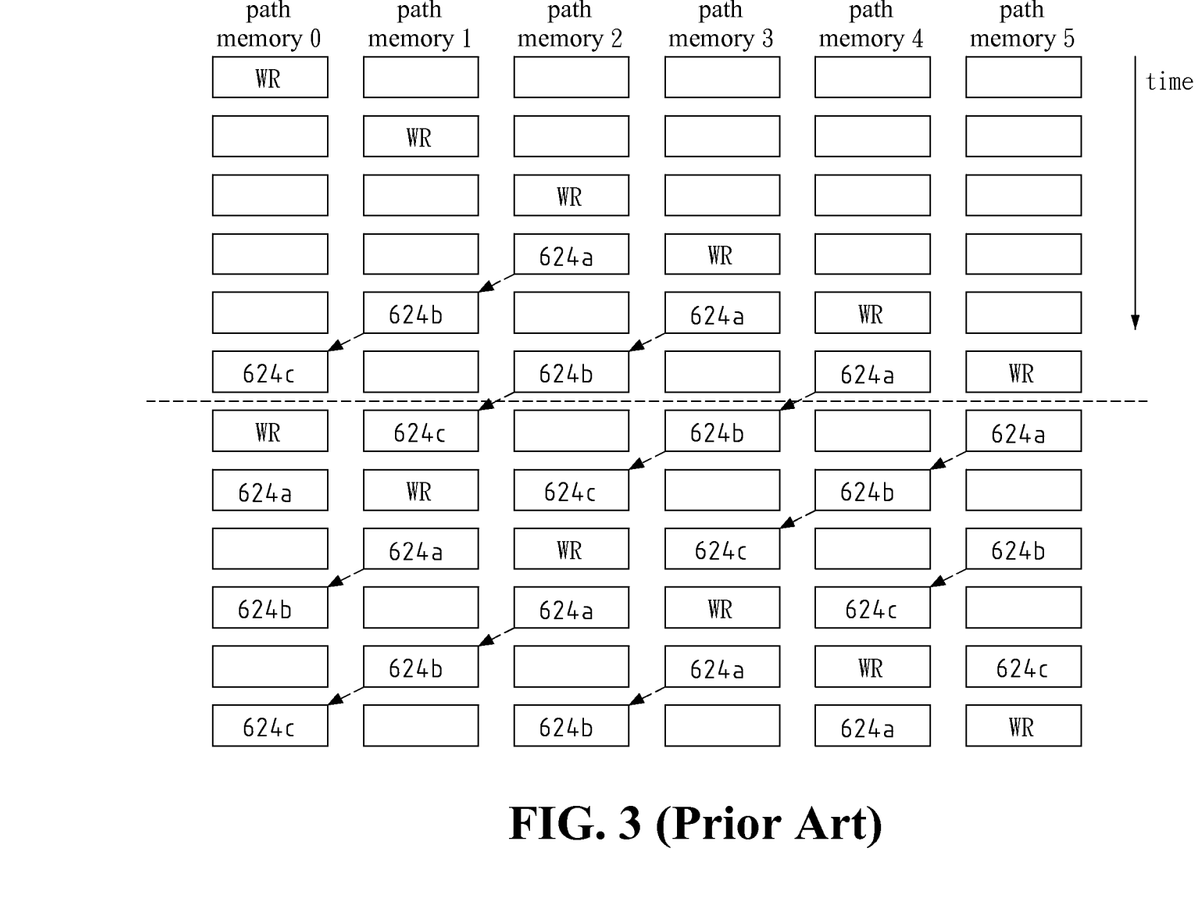
FIG. 3 shows a three-pointer even method for memory management.

FIG. 3 shows a conventional three-pointer even method of memory management. The memory management method is applicable to the implementation of the traceback approach. By dividing the memory into a plurality of memory blocks, this method allows the parallel execution of the reading and writing to the memory. However, this method has an utilization rate of 4/6 for the memory; that is, four out of the allocated six blocks must be in use simultaneously. As the memory access uses about 80% of the power consumption, it is important to reduce the memory access and shut down the power to the memory block when the block is not in use so that the overall power consumption can be reduced.

The conventional Viterbi decoder utilizes path memory to store each stage and the survivor branch of each stage. The traceback starts when the depth of the stored stages reaches about 5-6 times of the constraint length. During the traceback, the state of last stage having the minimum path metric is first found, and then the survivor path in the path memory is read to compute the state of the previous stage in the survivor path. This process must be done stage by stage, and the path memory must be accessed in each stage. Until traceback is at the end of the survivor path, the decoded bits can be obtained. Because the number of memory accesses is large, the power consumption of this method is also large.

Figure 4:
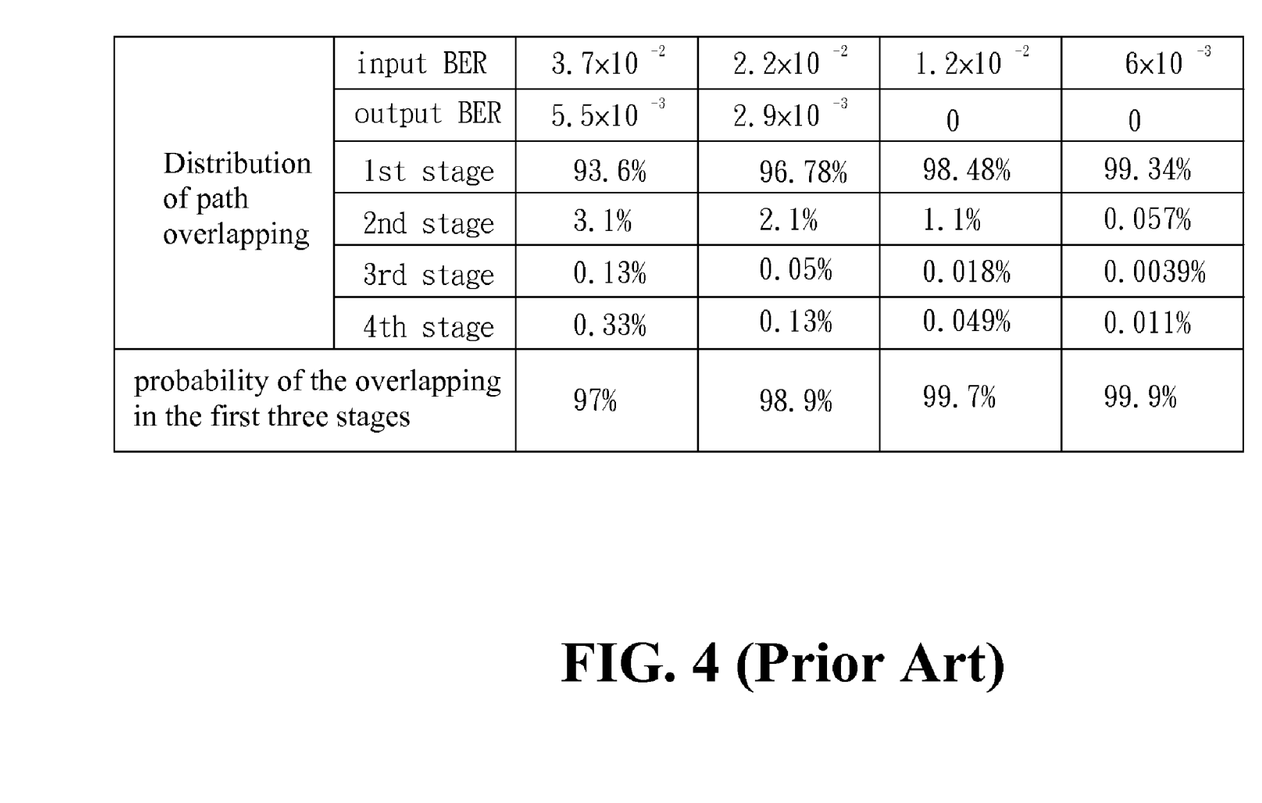
FIG. 4 shows the relation between bit error rate (BER) and path overlapping.

FIG. 4 shows the relationship between the bit error rate (BER) and the path overlapping. A conventional prediction method utilizes the relationship between the BER and the path overlapping. When the input signal of the Viterbi decoder has a BER less than $3.7 \times 10^{-2}$, the probability of the overlapping of the traceback path and the survivor path in the first three stages is higher than 97%. There are two important issues in this relationship. First, in a low BER system, the probability that the previous traceback path overlaps the current traceback path is high. If the information of the previous traceback path can be stored, the remaining traceback can be saved when the paths overlap. This also saves the power used in path memory access. Second, the survivor branch is recorded whenever an input signal arrives. If each stage computes the state of the minimum path metric, and determines the legitimacy of the state in the survivor path based on whether a connection exists between this state and the state of the minimum path metric of the previous stage, under the low BER condition, there will be a high probability that the survivor path will consist of the states of the minimum path metric of each stage.

In this conventional prediction method, six corresponding state buffers are used in addition to the six path memories of a conventional Viterbi decoder. The state buffers record the state sequence of the previous traceback path and the most likely correct state sequence predicted by the prediction mechanism. When the predicted minimum states are connected, the state of the minimum path metric in the previous stage is recorded in the state buffer. During the traceback, if the traceback path overlaps the path in the state buffer, the connected state stored in the state buffer can be directly used to obtain the decoded bits. Thus, no further path memory access is required for the decoding. When the channel condition is good, that is, the path prediction mechanism is correct, 75% of memory access is saved in comparison to the traceback approach of the conventional Viterbi decoder. The power consumption is greatly reduced.

Take the structure of the conventional three-pointer even method as an example. There are four memory blocks operating simultaneously in the Viterbi decoder using a traceback approach. The conventional prediction method, when the path prediction mechanism is completely correct, writes the state of the minimum path metric of the previous stage into only one memory block, When the channel condition is good, that is, the path prediction mechanism is correct, it still requires to use the traceback to observe the connected relationship to obtain the decoded bits.

For wireless communication products, the power consumption criterion is more restrictive because of the mobility. Although the traceback approach uses less power and less memory area than the register exchange approach, and is already widely used, it is still a challenge to further lower the power consumption.

SUMMARY OF THE INVENTION

The present invention has been made to overcome the aforementioned drawback of a conventional Viterbi decoder. The primary object of the present invention is to provide a prediction device applicable to the Viterbi decoder using the traceback approach for reducing the count of memory accesses and lowering the power consumption in a low BER system. The Viterbi decoder includes a path computing module, a path metric comparison module, a plurality of path memories, a traceback module, and a storage control module. In accordance with the present invention, the prediction device comprises a prediction module and a plurality of decoded bit storages.

Based on the following: (1) a prediction activation signal from the storage control module, (2) a path source of each state in the current stage from the path computing module, (3) the state of the minimum path metric of the current stage from the path metric comparison module and (4) the state of the minimum path metric of the previous stage stored in the prediction module, the prediction module determines whether the state of the minimum path metric of the previous stage is connected to the state of the minimum path metric of the current stage, stores the state of the minimum path metric of the current stage, generates at least a decoded bit, and outputs a prediction success signal to the storage control module.

Each of the plurality of decoded bit storages corresponds to a path memory, and stores at least a decoded bit outputted by prediction module or by the traceback module sequentially. A signal is arranged by the storage control module to be outputted to a decoded bit storage at a preset output time, and all the decoded bits stored in this decoded bit storage are outputted.

Another object of the present invention is to provide a prediction method applicable to the aforementioned Viterbi decoder, where the storage control module of the Viterbi decoder includes a plurality of counters, and each counter corresponds to a decoded bit storage. The prediction method comprises the following steps of: (a) using a prediction module to determine, based on a plurality of parameters from the Viterbi decoder and a state of the minimum path metric of the previous stage stored in the prediction module, whether the state of the minimum path metric of the current stage is connected to the state of the minimum path metric of the previous stage; if not, stopping the prediction method until a preset activation condition is met and returning to step (a); (b) generating at least a decoded bit of the current stage, storing sequentially the decoded bit to one of the plurality of decoded bit storage, and adjusting the counter corresponding to the decoded bit storage being currently processed; (c) using a traceback mechanism to determine whether to directly output all the decoded bits in one of the decoded bit storage at a preset output time; and (d) transmitting a decoded bit signal from the storage control module to the decoded bit storage corresponding to the last path memory being already tracedback, and outputting all decoded bits stored in the decoded bit storage.

During writing to the path memory of the Viterbi decoder, the prediction device of the present invention records the decoded bits when the predicted minimum states are connected. During the traceback, if the state of the current stage equals to the combination of the decoded bits of the previous several stages, it means the paths are overlapping. Thus, no further path memory access is required for the decoding, and the decoded bits can be directly outputted. When the channel condition is good, that is, the path prediction mechanism is correct, 75% of memory access is saved in comparison to the traceback approach of the conventional Viterbi decoder. The power consumption is greatly reduced.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 5A:
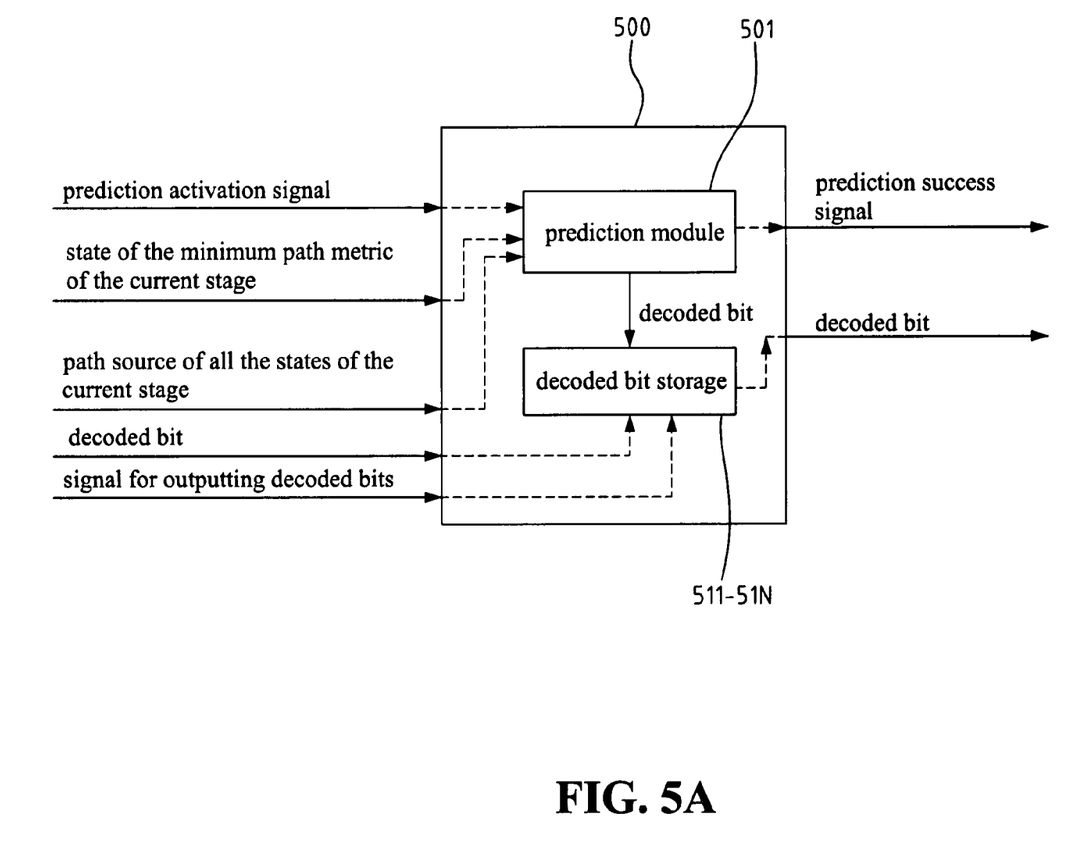
FIG. 5A shows a schematic view of a prediction device of the present invention.
Figure 5B:
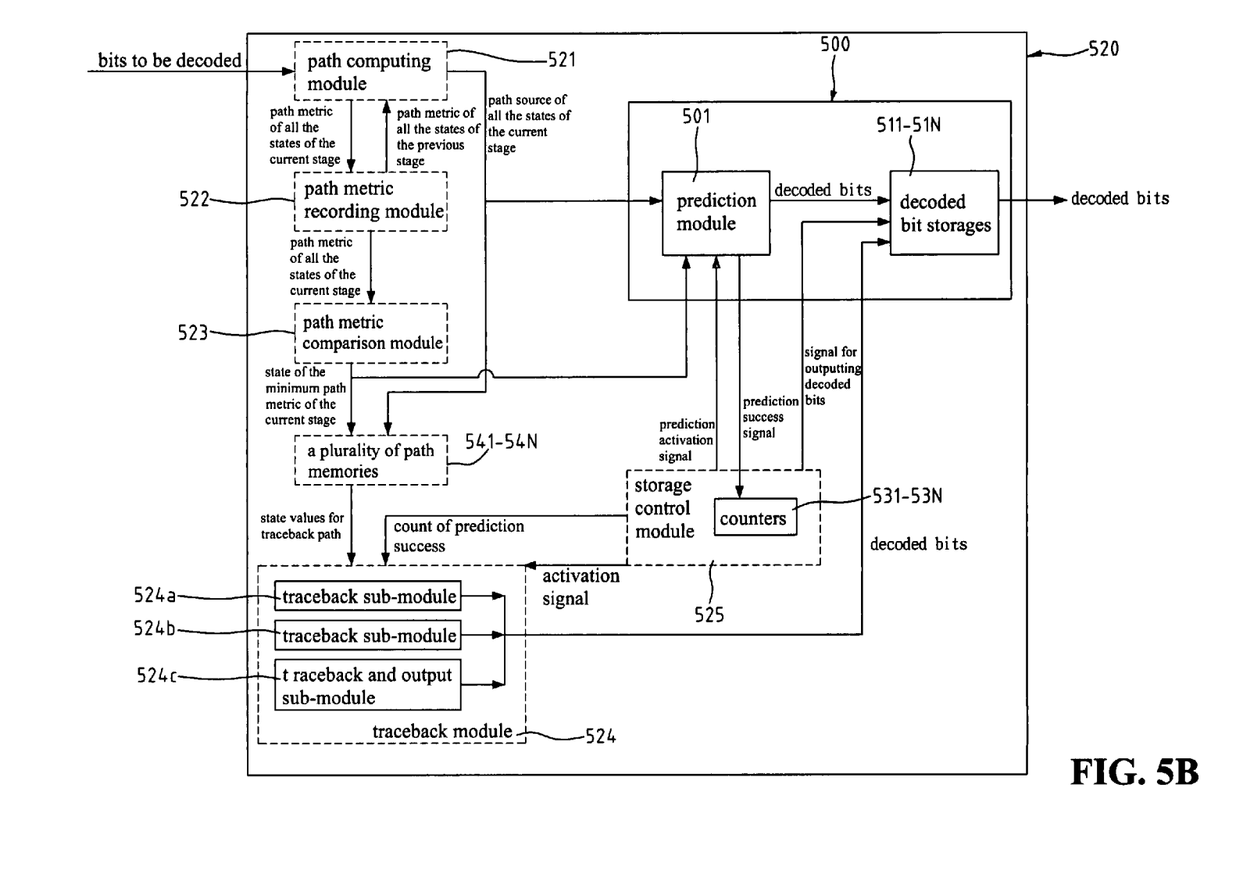
FIG. 5B shows a structure diagram of the prediction device of the present invention applied in a Viterbi decoder.

FIG. 5A shows a schematic view of a prediction device of the present invention and FIG. 5B shows a structure diagram of the prediction device of the present invention applied in a Viterbi decoder.

As shown in FIG. 5A and FIG. 5B, a prediction device 500 of the present invention is applied in a Viterbi decoder 520. Prediction device 500 comprises a prediction module 501 and a plurality of decoded bit storages 511-51N.

Viterbi decoder 520 comprises a path computing module 521, a path metric recording module 522, a path metric comparison module 523, a plurality of path memories 541-54N, a traceback module 524, and a storage control module 525.

Path computing module 521 is for computing the path metric of each state. By adding the tallied path metric of the previous stage to that of the survivor branch of each state, the current path metric can be obtained. Path metric recording module 522 is for recording the path metric of all the states and providing to path metric comparison module 523 for comparison. Path metric comparison module 523 compares the path metric of all the states, and finds the minimum as the starting point for traceback path. Storage control module 525 is for power management of the memories and the activation control of its peripheral modules.

As shown in FIG. 5B, based on an activation signal to the prediction mechanism signal outputted by storage control module 525, the path source of all the states of the current stage outputted by path computing module 521, the state of the minimum path metric of the current stage outputted by path metric comparison module 523, and the state of the minimum path metric of the previous stage stored in prediction module 501, prediction module 501 determines whether the state of the minimum path metric of the previous stage is connected to the state of the minimum path metric of the current stage. If so, the decoded bits of the current stage will be stored in decoded bit storages 511-51N, the state of the minimum path metric of the current stage is also stored, and a prediction success signal is sent to storage control module 525. Otherwise, the prediction is terminated until the current path memory is full. When the writing to the next path memory starts, the prediction mechanism is re-activated.

Each decoded bit storage 51N corresponds to a path memory 54N, and sequentially stores the decoded bits outputted by prediction module 501 or the decoded bits outputted by traceback module 524. A signal for outputting decoded bits is transmitted at a preset output time by storage control module 525 to a decoded bit storage 51N to output all the decoded bits stored in this decoded bit storage 51N.

Figure 6:
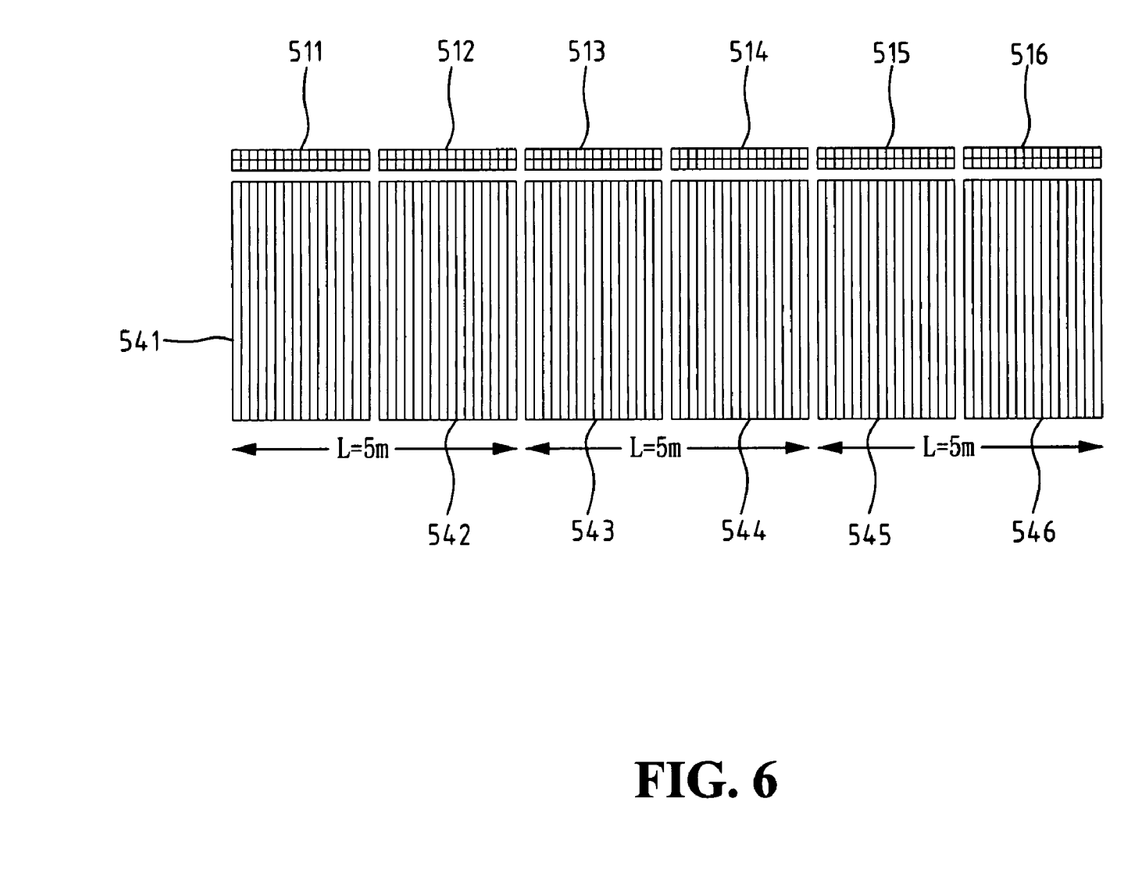
FIG. 6 shows the relation between the decoded bit storage and the path memory.

FIG. 6 gives an example to show the relation between the decoded bit storage and the path memory. In the example, a radix-4 design is employed. Although the hardware of the radix-4 design is twice complex as that of a radix-2 design, the processing speed is also twice as fast. Under the same data processing speed circumstances, the radix-4 design operates at a lower frequency and consumes less power. The truncation length of the present design is 64 bits.

As shown in FIG. 6, the present design includes six path memories and six decoded bit storages, and one path memory corresponds to a decoded bit storage. The present design uses single port RAM as the path memory, each having the size of 128×16 bits. The path memory is divided into 16 stages, with each stage having 64 states. Each stage records a path source of each state, and each state uses two bits to store the survivor branch. The size of each decoded bit storage is 2×16 bits, and each stage stores two decoded bits. Traceback module 524 includes two traceback sub-modules 524a, 524b, and a traceback and output sub-module 524c for the traceback of the maximum possible path. Storage control module 525 at least comprises six counters 531-536, corresponding to six decoded bit storages 511-516. Each counter, based on the prediction success signal outputted by prediction module 501, tallies the count of prediction successes.

According to the conventional three-pointer even method for memory management shown in FIG. 3, when three path memories are full (marked as WR in the figure), the traceback starts, and the writing to the next path memory can also continue. At the beginning of traceback, storage control module 525 refers to the counter of the corresponding decoded bit storage of the first path memory being traced back. If the count in the counter is 16, traceback sub-module 524a is shut down and traceback is not necessary. Otherwise, traceback is required and sub-module 524a is activated. The decoded bits during the traceback are recorded in the decoded bit storage corresponding to the path memory being traced back.

Traceback sub-module 524b is for the traceback of the second path memory. The operation mode of the traceback is similar to that of the traceback submodule 524a. Traceback and output sub-module 524c is for the traceback of the third path memory. The operation mode of the traceback is similar to those of the traceback sub-modules 524a, 524b. When finishing the traceback, the decoded bits stored in the decoded bit storage are all outputted.

Figure 7A:
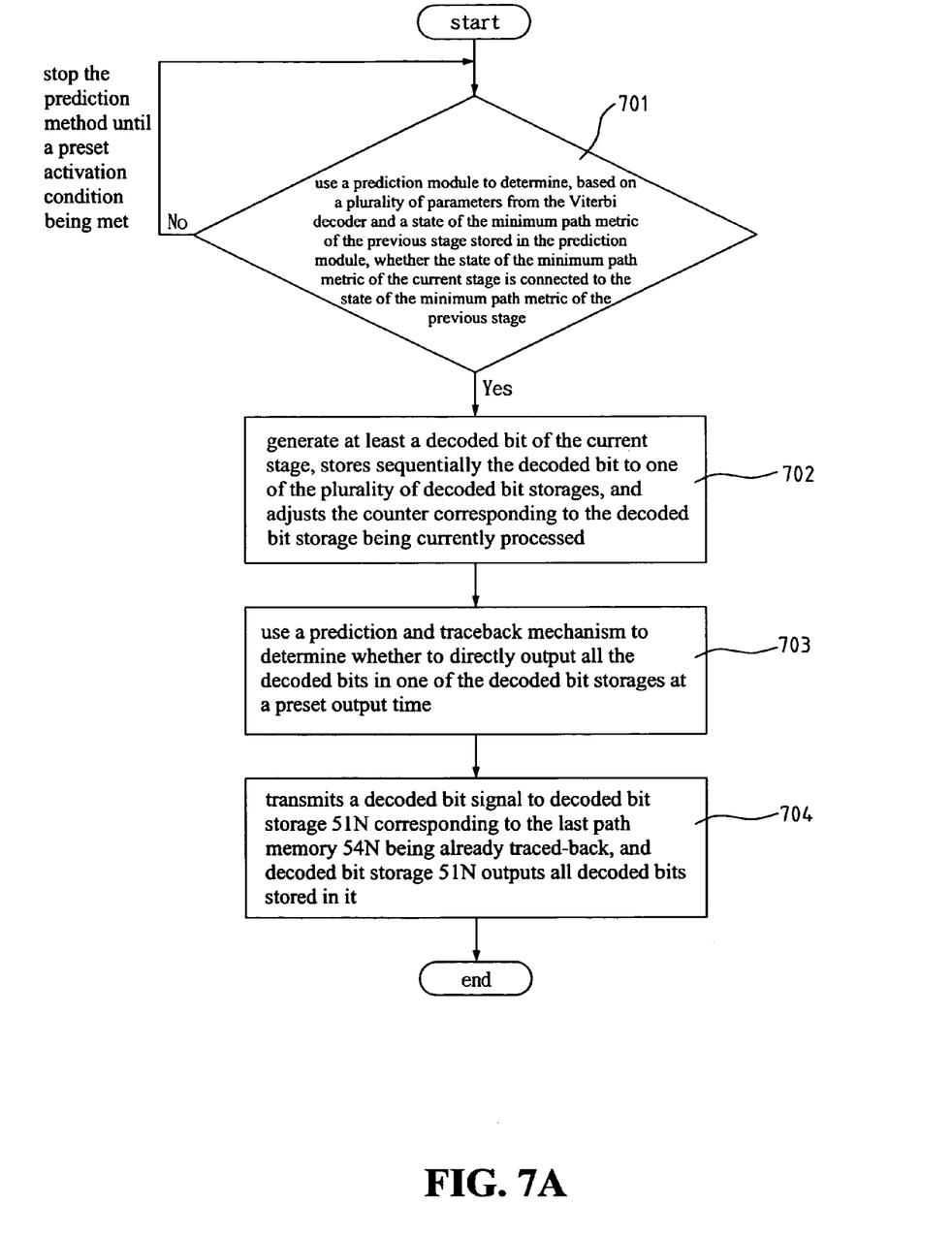
FIG. 7A shows a flowchart of the prediction method of the present invention applied in a Viterbi decoder in FIG. 6B.

FIG. 7A shows a flowchart of the prediction method used in the Viterbi decoder of FIG. 5B. Each counter corresponds to a decoded bit storage.

As shown in FIG. 7A, step 701 is to use prediction module 501 to determine, based on a plurality of parameters from the Viterbi decoder and a state of the minimum path metric of the previous stage stored in prediction module 501, whether the state of the minimum path metric of the current stage is connected to the state of the minimum path metric of the previous stage. If not, stop the prediction method, i.e., deactivate prediction module 501, until a preset activation condition is met and return to step 701.

According to the present invention, parameters from the Viterbi decoder include a prediction activation signal from storage control module 525, a path source of each state in the current stage from path computing module 521, and the state of the minimum path metric of the current stage from path metric comparison module 523. The preset activation condition is set at the time when the current path memory is full and the writing to the next path memory is about to start. At this time, storage control module 525 sends an activation signal to activate prediction module 501.

Step 702 is to generate at least a decoded bit of the current stage, store sequentially the decoded bit to one of the plurality of decoded bit storages 511-51N, and adjust the counter corresponding to the decoded bit storage being currently processed. Step 703 is to use a prediction and traceback mechanism to determine whether to directly output all the decoded bits in one of the decoded bit storages at a preset output time. Finally, in step 704, storage control module 525 transmits a decoded bit signal to decoded bit storage 51N corresponding to the last path memory 54N being already traced-back, and decoded bit storage 51N outputs all decoded bits stored in it.

The following uses the radix-4 design in FIG. 6 to explain the prediction method applied in the Viterbi decoder.

Prediction module 501 uses the plurality of parameters from the Viterbi decoder and the parameter stored in prediction module 501 to determine if the state of the minimum path metric of the current stage is connected to the state of the minimum path metric of the previous stage (as in step 701). If connected, the two decoded bits of this stage are generated and stored sequentially to one of the six decoded bit storages, and counter 53N corresponding to the currently processed decoded bit storage is incremented by 1 (step 702). Then a prediction and traceback module is used to determine whether to directly output all the 32 decoded bits in one of the decoded bit storages at a preset output time (step 703). Finally, the decoded bit storage corresponding to the last path memory being already traced-back outputs all the 32 decoded bits stored in it.

Figure 7B:
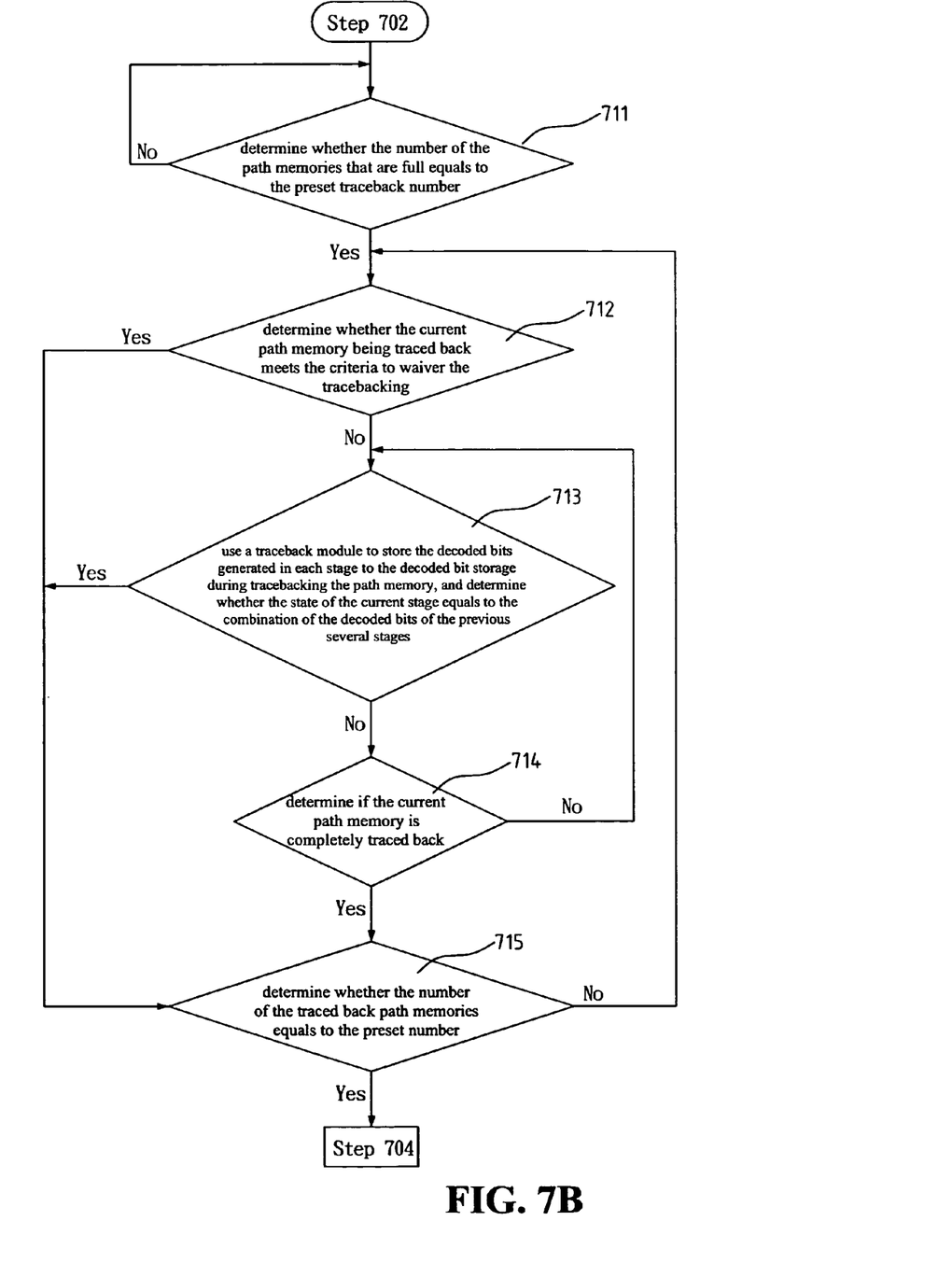
FIG. 7B shows a flowchart for operating the prediction and traceback mechanism according to the present invention.

FIG. 7B shows a flowchart for operating the prediction and traceback mechanism according to the present invention. Step 703 in FIG. 7A includes the following five steps.

In step 711, a test is conducted to determine whether the number of the path memories that are full equals to the preset traceback number. If so, the traceback starts and step 712 is taken. Otherwise, repeat step 711. According to the three-pointer even method for memory management, when three path memories are full, the traceback starts and the writing to the next path memory continues.

In step 712, a test is conducted to determine whether the current path memory being traced back meets the criteria to waive the traceback. If so, skip to step 715; otherwise, take step 713. As shown in FIG. 6, each decoded bit storage is 32-bit and traceback sub-module 524a is executing the traceback for the third path memory. When the counter corresponding to the third path memory equals to 16, it means that the channel condition is good and all the predictions are correct. The traceback sub-module 524a can be shut down, and no further traceback is required.

Step 713 is to use a traceback module to store the decoded bits generated in each stage to the decoded bit storage during the traceback of the corresponding path memory, and determine whether the state of the current stage equals to the combination of the decoded bits of the previous several stages. If so, no further traceback is required and step 715 is taken; otherwise, step 714 is taken.

At the beginning of traceback, storage control module 525 refers to the counter of the corresponding decoded bit storage of the first path memory being traced back. If the count in the counter is not 16, sub-module 524a is activated and the traceback starts with the use of values stored in path memory. Traceback sub-module 524a stores the decoded bits to corresponding decoded bit storage. When the number of the traced back stages equals to the sum of the count in the counter and 1, storage control module 525 determines whether the state of the minimum path metric of the current stage equals to the combination of the decoded bits of the previous several stages. If so, it means the paths are overlapping. Then, the counter is set to 16 and traceback sub-module 524a is shut down. Otherwise, traceback is continued until the end of the path memory is reached. For example, during the traceback, when the state of the current stage (6 bits) equals to the effective combination of the decoded bits of the previous three stages, the paths overlap, and the sub-module 524a can be shut down. When traceback reaches k-th stage, the state is 011100, and the decoded bits of (k-1)th stage, (k-2)th stage, and (k-3)th stage are 00, 11, and 01, respectively, the paths overlap.

Traceback sub-module 524b is for the traceback of the second path memory. The operation mode of the traceback is similar to that of the traceback sub-module 524a. Traceback and output sub-module 524c is for the traceback of the third path memory, and is required to perform traceback and decoding. The operation mode of the traceback is similar to those of the traceback sub-modules 524a, 524b. When finishing traceback, the decoded bits stored in the decoded bit storage are all outputted.

Step 114 is to determine if the current path memory is completely traced back. If so, proceed to the next path memory for traceback and take step 715; otherwise, return to step 713.

Finally, step 715 is to determine whether the number of the traced back path memories equals to the preset number. If so, go to step 704; otherwise, return to step 712. According to the conventional three-pointer even method for memory management, when three path memories are traced back, step 704 can be taken to output all the decoded bits stored in the decoded bit storage corresponding to the third path memory.

In addition to the path memory of a conventional Viterbi decoder, the present invention also includes decoded bit register (as shown in FIG. 6). When the predicted minimum states are connected, the decoded bits are recorded. During the traceback, if the path overlapping is found, no access to the path memory is required for the decoding. Instead, the decoded bits can be directly outputted. When the channel condition is good, that is, the path prediction mechanism is correct, 75% of memory access is saved in comparison to the traceback approach of the conventional Viterbi decoder. The power consumption is greatly reduced.

Figure 8:
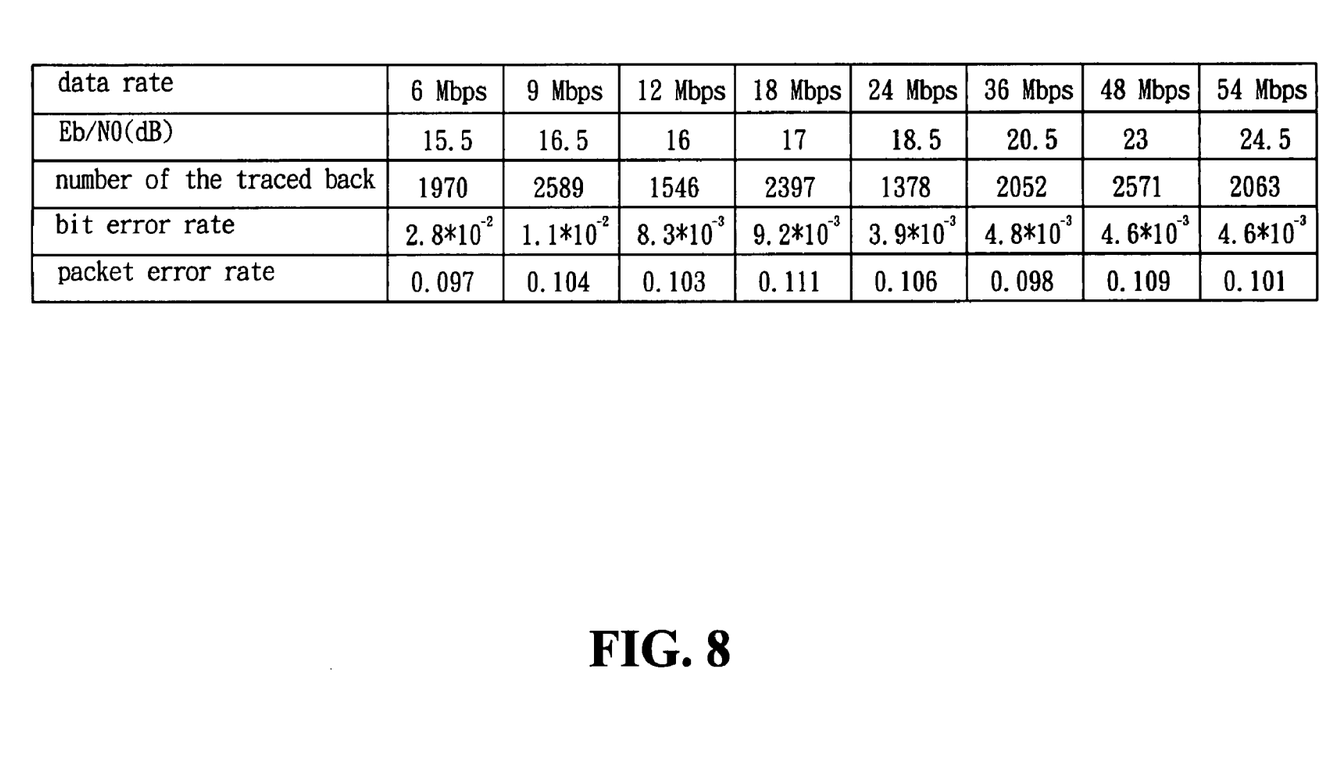
FIG. 8 shows the simulation results of the present invention.

FIG. 8 shows the simulation results of the present invention. The simulation meets the IEEE 802.11a specification, with multipath channel delay time $T_{rms}$=50 ns, frequency offset=40 ppm, and timing offset=40 ppm.

The simulation simulates the number of traceback of each packet at various data rates. The number of packets is 1000, and each packet is 1000-byte long. In a conventional three-pointer even method, the required traceback is 11947 times at all data rates. However, as it is found that less than 1/5 tracebacks are required when the prediction device is activated. From the simulation results, it shows that the number of memory access is reduced, and the power consumption is also reduced.

The difference between the present invention and the conventional techniques is that the present invention stores decoded bits in the decoded bit storage, while the conventional techniques store the state value. The conventional techniques require traceback to output decoded bits, while the present invention can directly output the decoded bits when the path overlapping occurs.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A prediction device applicable to a Viterbi decoder, said Viterbi decoder at least comprising a path computing module, a path metric comparison module, a plurality of path memories, a traceback module and a storage control module, said prediction device comprising:

a prediction module receiving a path source of all states in a current stage from said path computing module and the state of the minimum path metric of the current stage from said path metric comparison module to determine whether the state of the minimum path metric of a previous stage is connected to the state of the minimum path metric of the current stage based on a prediction activation signal from said storage control module and the state of the minimum path metric of the previous stage stored in said prediction module, and outputting a prediction success signal to said storage control module; and a plurality of decoded bit storages, each of said decoded bit storages corresponding to one of said path memories, and storing at least a decoded bit outputted by said prediction module or by said traceback module sequentially.

2. The prediction device as claimed in claim 1, wherein said storage control module comprises a plurality of counters, with each counter corresponding to one of said decoded bit storages, and each counter being increased by 1 when it receives a prediction success signal.

3. The prediction device as claimed in claim 1, wherein said storage control module sends a signal to said decoded bit storages at a preset output time for outputting all decoded bits stored in one of said plurality of decoded bit storages.

4. The prediction device as claimed in claim 3, wherein said preset output time is the time of finishing traceback.

5. A prediction method applicable to a Viterbi decoder, said Viterbi decoder at least comprising a path computing module, a path metric comparison module, a plurality of path memories each corresponding to one decoded bit storage, a traceback module and a storage control module, said storage control module at least comprising a plurality of counters with each counter corresponding to one decoded bit storage, said prediction method comprising the following steps of:

(a) using a prediction module to determine whether the state of the minimum path metric of a current stage is connected to the state of the minimum path metric of a previous stage based on a prediction activation signal from said storage control module and the state of the minimum path metric of the previous stage stored in said prediction module, said prediction module receiving a path source of all states in the current stage from said path computing module and the state of the minimum path metric of the current stage from said path metric comparison module;

(b) waiting until a preset condition is met to return to step (a) for activating prediction if the state of the minimum path metric of the current stage is not connected to the state of the minimum path metric of the previous state; and (c) generating at least a decoded bit of the current stage, storing sequentially the decoded bit to one of said decoded bit storages, and adjusting the counter corresponding to the decoded bit storage currently used.

6. The prediction method as claimed in claim 5, further comprising the steps of:

(d) using a traceback mechanism to determine whether to directly output all the decoded bits in one of said decoded bit storages at a preset output time; and (e) transmitting a decoded bit signal from said storage control module to the decoded bit storage corresponding to a last path memory being already traced-back, and outputting all decoded bits stored in the corresponding decoded bit storage.

7. The prediction method as claimed in claim 6, wherein said traceback mechanism of step (d) further comprising the following steps of:

(d1) determining whether the number of said path memories that are full is equal to a preset traceback number, and repeating step (d1) if the number is not equal;

(d2) going to step (d5) if a current path memory being traced back meets a criteria to waive traceback;

(d3) using said traceback module to store the decoded bits generated in each stage to the decoded bit storage of the current path memory during traceback, and going to step (d5) if the state of the current stage is equal to a combination of the decoded bits of previous several stages;

(d4) returning to step (d3) if the current path memory is not completely traced back yet; and (d5) returning to step (e) if the number of path memories that have been traced back is equal to said preset traceback number; otherwise, going to step (d2).

8. The prediction method as claimed in claim 7, wherein said criteria to waive traceback in said step (d2) is that the value in the counter corresponding to the decoded bit storage of the current path memory equals to total stages recorded by the current path memory.

9. The prediction method as claimed in claim 8, wherein the total recorded stages is 16.

10. The prediction method as claimed in claim 9, wherein the total number of decoded bits stored in said step (d3) equals to 32.

11. The prediction method as claimed in claim 7, wherein said preset traceback number is 3.

12. The prediction method as claimed in claim 6, wherein said preset output time is the time of finishing traceback.

13. The prediction method as claimed in claim 5, wherein said preset condition for activating prediction is that a current path memory is full and the processing of a next path memory is about to start.

* * * * *